United States Patent
Cheng et al.

(10) Patent No.: US 10,770,588 B2
(45) Date of Patent: *Sep. 8, 2020

(54) (110) SURFACE ORIENTATION FOR REDUCING FERMI-LEVEL-PINNING BETWEEN HIGH-K DIELECTRIC AND GROUP III-V COMPOUND SEMICONDUCTOR DEVICE

(71) Applicant: Taiwan Semiconductor Manufacturing Company, Ltd., Hsin-Chu (TW)

(72) Inventors: Chao-Ching Cheng, Hsinchu (TW); Chih-Hsin Ko, Kaohsiung County (TW); Hsingjen Wann, Carmel, NY (US)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 13 days.

This patent is subject to a terminal disclaimer.

(21) Appl. No.: 15/225,298

(22) Filed: Aug. 1, 2016

(65) Prior Publication Data

US 2016/0343846 A1 Nov. 24, 2016

Related U.S. Application Data

(63) Continuation of application No. 13/299,529, filed on Nov. 18, 2011, now Pat. No. 9,406,518.

(51) Int. Cl.
*H01L 29/78* (2006.01)
*H01L 29/45* (2006.01)
(Continued)

(52) U.S. Cl.
CPC ...... *H01L 29/785* (2013.01); *H01L 21/28264* (2013.01); *H01L 21/3081* (2013.01);
(Continued)

(58) Field of Classification Search
None
See application file for complete search history.

(56) References Cited

U.S. PATENT DOCUMENTS 7,625,790 B2 12/2009 Yang
7,842,559 B2 11/2010 Jakschik et al.
(Continued)

OTHER PUBLICATIONS

Eun Ji Kim et al., "Automatically Abrupt and Unpinned Al2O3/In0.53Ga0.47As Interfaces: Experiment and Simulation", Journal of Applied Physics 106, 124508 (2009), 8 pages (Year: 2009).*

(Continued)

*Primary Examiner* — Davienne N Monbleau
*Assistant Examiner* — Scott R Wilson
(74) *Attorney, Agent, or Firm* — Haynes and Boone, LLP (57) ABSTRACT

A device with improved device performance, and method of manufacturing the same, are disclosed. An exemplary device includes a group III-V compound semiconductor substrate that includes a surface having a (110) crystallographic orientation, and a gate stack disposed over the group III-V compound semiconductor substrate. The gate stack includes a high-k dielectric layer disposed on the surface having the (110) crystallographic orientation, and a gate electrode disposed over the high-k dielectric layer.

20 Claims, 4 Drawing Sheets

(51) Int. Cl.

| | |
|---|---|
| H01L 29/51 | (2006.01) |
| H01L 29/66 | (2006.01) |
| H01L 29/04 | (2006.01) |
| H01L 29/20 | (2006.01) |
| H01L 21/28 | (2006.01) |
| H01L 21/308 | (2006.01) |
| H01L 29/06 | (2006.01) |
| H01L 29/49 | (2006.01) |

(52) U.S. Cl.
CPC ........ *H01L 29/045* (2013.01); *H01L 29/0649* (2013.01); *H01L 29/20* (2013.01); *H01L 29/452* (2013.01); *H01L 29/4916* (2013.01); *H01L 29/517* (2013.01); *H01L 29/66522* (2013.01)

(56) References Cited

U.S. PATENT DOCUMENTS

| | | | |
|---|---|---|---|
| 7,923,314 | B2 | 4/2011 | Tezuka et al. |
| 8,524,562 | B2 | 9/2013 | Wang et al. |
| 9,406,518 | B2* | 8/2016 | Cheng ............... H01L 21/28264 |
| 2005/0186742 | A1* | 8/2005 | Oh .................... H01L 29/66818 438/283 |
| 2007/0152276 | A1 | 7/2007 | Arnold et al. |
| 2007/0190675 | A1 | 8/2007 | Yamazaki et al. |
| 2008/0286967 | A1 | 11/2008 | Good et al. |
| 2009/0026540 | A1* | 1/2009 | Sasaki ............... H01L 29/66803 257/344 |
| 2009/0090934 | A1* | 4/2009 | Tezuka ................ H01L 27/1211 257/190 |
| 2009/0159972 | A1* | 6/2009 | Jakschik ................. H01L 21/84 257/350 |
| 2012/0001239 | A1* | 1/2012 | Ko .................... H01L 29/66795 257/255 |
| 2013/0102130 | A1* | 4/2013 | Cheng ............... H01L 29/66477 438/478 |
| 2013/0126985 | A1 | 5/2013 | Cheng et al. |

OTHER PUBLICATIONS (IDS Reference 2) Eun Ji Kim et al., "Automatically Abrupt and Unpinned Al2O3/In0.53Ga0.47As Interfaces: Experiment and Simulation," Journal of Applied Physics 106, 124508 (2009), 8 pages.

* cited by examiner

(110) SURFACE ORIENTATION FOR REDUCING FERMI-LEVEL-PINNING BETWEEN HIGH-K DIELECTRIC AND GROUP III-V COMPOUND SEMICONDUCTOR DEVICE

PRIORITY DATA

The present application is a continuation application of U.S. application Ser. No. 13/299,529, filed Nov. 18, 2011, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down also presents critical challenges for manufacturing and processing IC devices. For example, group III-V semiconductor material based channel devices have been introduced that can provide improved device performance when compared to silicon based channel devices. However, achieving electrically passive interfaces between group III-V semiconductor materials and insulator materials (such as a gate dielectric layer) have proved difficult. Such interfaces typically exhibit electrically active defects that cause group III-V semiconductor material based channel devices to perform similarly, if not worse than, silicon based channel devices. Accordingly, although existing group III-V semiconductor material based channel devices and methods of manufacturing the same have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
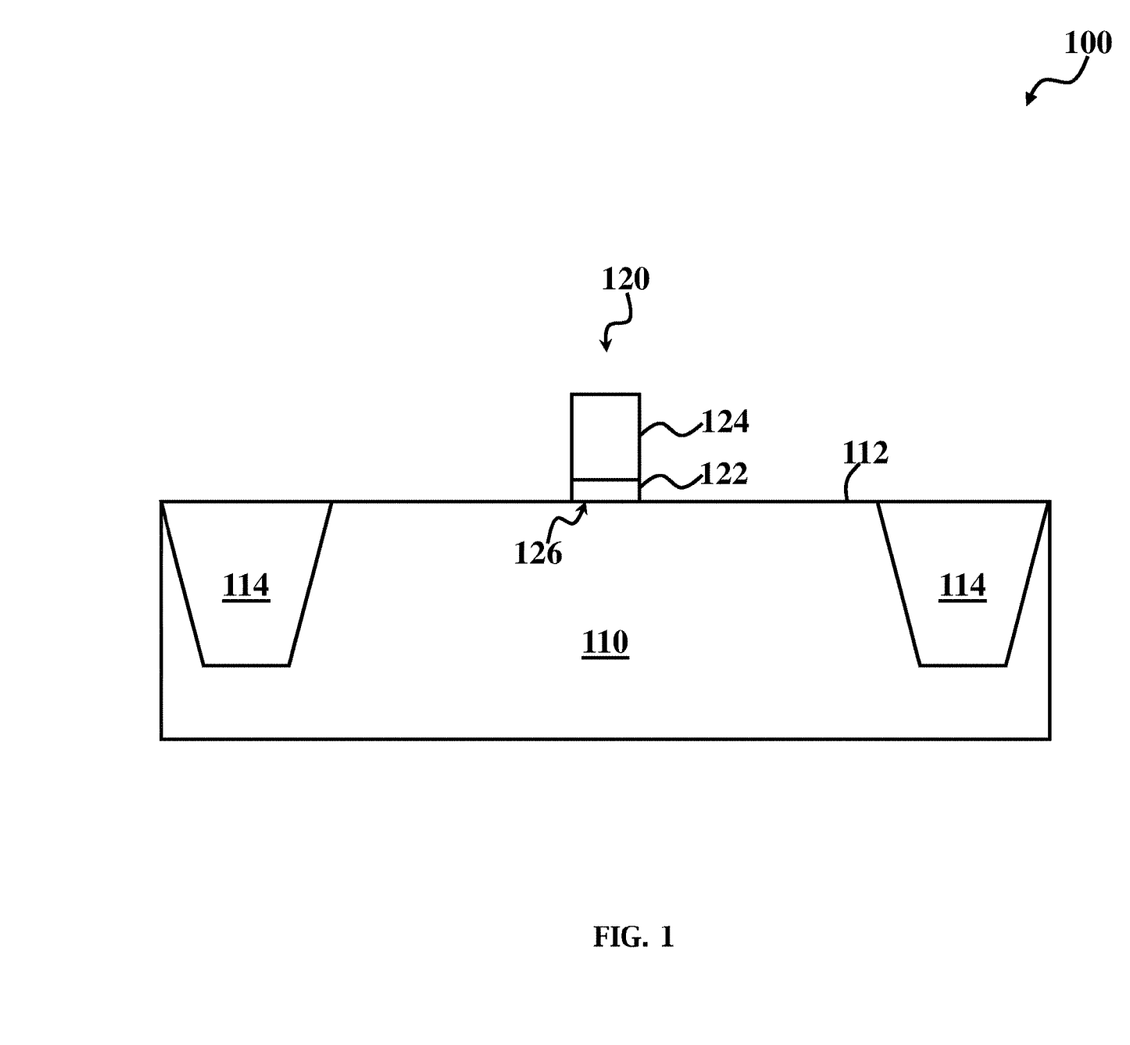
FIG. 1 is a diagrammatic cross-sectional view of an integrated circuit device according to various aspects of the present disclosure.

FIG. 1 is a diagrammatic cross-sectional view of a device 100, in portion or entirety, according to various aspects of the present disclosure. FIG. 1 has been simplified for the sake of clarity to better understand the inventive concepts of the present disclosure. In an example, the device 100 is a metal-oxide-semiconductor capacitor (MOSCAP). In another example, the device 100 is a field effect transistor, such as a planar metal-oxide-semiconductor field effect transistor (MOSFET), a double gate MOSFET, or a tri-gate MOSFET. The device 100 may include memory cells and/or logic circuits; passive components such as resistors, capacitors, inductors, and/or fuses; active components, such as n-channel field effect transistors (NFETs), p-channel field effect transistor (PFETs), metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the device 100, and some of the features described below can be replaced or eliminated for additional embodiments of the device 100.

The device 100 includes a substrate 110. The substrate 110 is a group III-V compound semiconductor substrate that includes a surface 112 having a (110) crystallographic orientation. In the depicted embodiment, the substrate 110 includes indium arsenide (InAs). The substrate 110 may thus be referred to as an indium arsenide (InAs) substrate. Alternatively or additionally, the substrate 110 includes gallium arsenide (GaS), gallium phosphide (GaP), indium phosphide (InP), aluminum arsenide (AlAs), gallium nitride (GaN), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), indium arsenide phosphide (InAsP), gallium indium arsenide phosphide (GaInAsP), other group III-V compound semiconductor materials, or combinations thereof. The substrate 110 includes various doping configurations depending on design requirements of the device 100. For example, the substrate 110 may include doped regions doped with p-type dopants, such as boron or $BF_2$; doped regions doped with n-type dopants, such as phosphorus or arsenic; or combinations thereof. The doped regions may be formed on the semiconductor substrate, in a P-well structure, in a N-well structure, in a dual-well structure, or using a raised structure.

Isolation feature 114 is disposed in the substrate 110 to isolate various regions and/or features of the device 100. The isolation feature 114 utilizes isolation technology, such as local oxidation of silicon (LOCOS) and/or shallow trench isolation (STI), to define and electrically isolate the various regions and/or features. The isolation feature 114 includes silicon oxide, silicon nitride, silicon oxynitride, other suitable material, or combinations thereof. In the depicted embodiment, the isolation feature 114 is a shallow trench isolation feature (STI) that includes an oxide material, such as silicon oxide. The isolation feature 114 is formed by a suitable process. For example, forming the STI feature includes using a lithography process to expose a portion of the substrate 110, etching a trench in the exposed portion of the substrate 110 (for example, by using a dry etching process, wet etching process, or combination thereof), and filling the trench (for example, by using a chemical vapor deposition process) with one or more dielectric materials. For example, the filled trench may have a multi-layer structure, such as a thermal oxide liner layer filled with silicon nitride or silicon oxide.

A gate stack 120 is disposed over the substrate 110. The gate stack 120 includes a gate dielectric layer 122 and a gate electrode layer 124. The gate stack 120 may include numerous other layers (such as capping layers, diffusion layers, barrier layers, hard mask layers, or combinations thereof) depending on design requirements of the device 100. The gate dielectric layer 122 is disposed over the substrate 110, specifically on the surface 112 having the (110) crystallographic orientation. In the depicted embodiment, the gate dielectric layer 122 includes a high-k dielectric material. Exemplary high-k dielectric materials include hafnium oxide ($HfO_2$), aluminum oxide ($Al_2O_3$), zirconium oxide ($ZrO_2$), gallium oxide ($Ga_2O_3$), titanium oxide ($TiO_2$), lanthanum oxide ($La_2O_3$), tantalum oxide ($Ta_2O_5$), gadolinium oxide ($Gd_2O_3$), yttrium oxide ($Y_2O_3$), hafnium dioxide-alumina ($HfO_2$—$Al_2O_3$) alloy, hafnium aluminum oxide (HfAlO), hafnium silicon oxide (HfSiO), hafnium silicon oxynitride (HfSiON), hafnium tantalum oxide (HMO), hafnium titanium oxide (HfTiO), hafnium zirconium oxide (HfZrO), titanium aluminum oxide (TiAlO), lanthanum aluminum oxide (such as $LaAlO_3$), other high-k dielectric material, or combinations thereof. The gate dielectric layer 122 is formed by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, other suitable process, or combinations thereof. In an example, the gate dielectric layer 122 is an aluminum oxide ($Al_2O_3$) layer formed by an atomic layer deposition process, and the gate dielectric layer 122 may be referred to as an ALD $Al_2O_3$ layer. In an example, the gate dielectric layer 122 is a hafnium oxide ($HfO_2$) layer, and the gate dielectric layer 122 may be referred to as an ALD $HfO_2$ layer.

The gate electrode layer 124 is disposed over the gate dielectric layer 122. The gate electrode layer 124 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the gate electrode layer 124 may be doped or undoped depending on design requirements of the device 100. The gate electrode layer 124 is formed by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, other suitable process, or combinations thereof.

The device 100 includes an interface 126 between the gate dielectric layer 122 and the group III-V compound semiconductor substrate 110, specifically the surface 112 having the (110) crystallographic orientation. The interface 126 is oxide-free, meaning that the interface 126 is substantially free of native oxide of the group III-V compound semiconductor substrate 110, such that virtually no detectable interfacial oxide exists between the gate dielectric layer 122 and the group III-V compound semiconductor substrate 110. The oxide-free interface 126 results because the surface 112 having the (110) crystallographic orientation is an electrically passive surface that can prevent (or substantially reduce) oxidation from occurring at the surface 112 of the group III-V compound semiconductor substrate 110, for example, before and during deposition of the gate dielectric layer 122. More specifically, it has been observed that the interface 126 exhibits lower defect density (in other words, a low density of electrically active defects) when the surface 112 has the (110) crystallographic orientation, as opposed to another crystallographic orientation, such as a (100) crystallographic orientation. Such lower defect density substantially reduces (or eliminates) Fermi level pinning, such that the interface 126 may also be referred to as an "unpinned interface." The interface 126 thus provides improved performance of the device 100. In the present example, where the group III-V compound semiconductor substrate 110 is the InAs substrate, the oxide-free interface 126 results because the surface 112 having the (110) crystallographic orientation has an equivalent number of anion (As ions) and cation (In ions) dangling bonds, which provides a balanced charge distribution at the surface 112 having the (110) crystallographic orientation, as compared to an InAs substrate where the surface has a (100) crystallographic orientation. Different embodiments may have different advantages, and no particular advantage is necessarily required of any embodiment.

The device 100 may further include doped regions disposed in the substrate 110. For example, a source region and a drain region are disposed in the substrate 110, such that the gate stack 120 interposes the source region and the drain region. The source region and the drain region may include lightly doped source and drain (LDD) regions, heavily doped source and drain (HDD) regions, other doped regions, or combinations thereof. A doping species of the doped regions depends on the type of device 100 being fabricated and includes p-type dopants, such as boron or $BF_2$, n-type dopants, such as phosphorus or arsenic, or combinations thereof. The doped regions are formed in the substrate 110 by ion implantation processes, lithography processes, diffusion processes, annealing processes (for example, rapid thermal annealing processes and/or laser annealing processes), other processes, or combinations thereof. The doped regions may further include raised source and drain features, such as epitaxial features. The raised source and drain features can be formed by an epitaxy process, such as a CVD deposition technique (for example, vapor-phase epitaxy (VPE) and/or ultra-high vacuum CVD (UHV-CVD)), molecular beam epitaxy, other process, or combinations thereof.

Spacers may be formed along sidewalls of the gate stack 120 (for example, along the gate dielectric layer 122 and the gate electrode 124). The spacers include a dielectric material, such as silicon oxide, silicon nitride, silicon oxynitride, other dielectric material, or combinations thereof. In an example, forming the spacers includes blanket depositing a first dielectric layer (such as a silicon oxide layer) over the device 100 and a second dielectric layer (such as a silicon nitride layer) over the first dielectric layer, and then, anisotropically etching to remove the dielectric layers to form the spacers.

The device 100 may undergo further processing to form various other features. For example, contact features, such as silicide regions, may be formed on the gate electrode layer 124 and/or the source and drain regions. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other silicide material, or combinations thereof. In an example, the contact features are formed by a salicide (self-aligned silicide) process. An interlevel dielectric layer (ILD) layer may be formed over the substrate 110. The ILD layer includes a dielectric material, such as silicon oxide, silicon nitride, silicon oxynitride, TEOS formed oxide, phosphosilicate glass (PSG), borophosphosilicate glass (BPSG), a low-k dielectric materials, other dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other low-k dielectric materials, or combinations thereof. The ILD layer can include a multilayer structure having multiple dielectric materials. A multilayer interconnect (MLI) structure (including various conductive and dielectric layers) may be formed over the substrate 110, configured to connect the various features or structures of the device 100. For example, the MLI structure may provide electrical interconnection to the device 100, such as to the gate stack 120 of the device 100. The MLI structure includes vertical interconnect features, such as vias or contacts, and horizontal interconnect features, such as conductive lines. The various MLI features include various conductive materials. In an example, a damascene or dual damascene process is used to form the MLI structure.

Figure 2A:
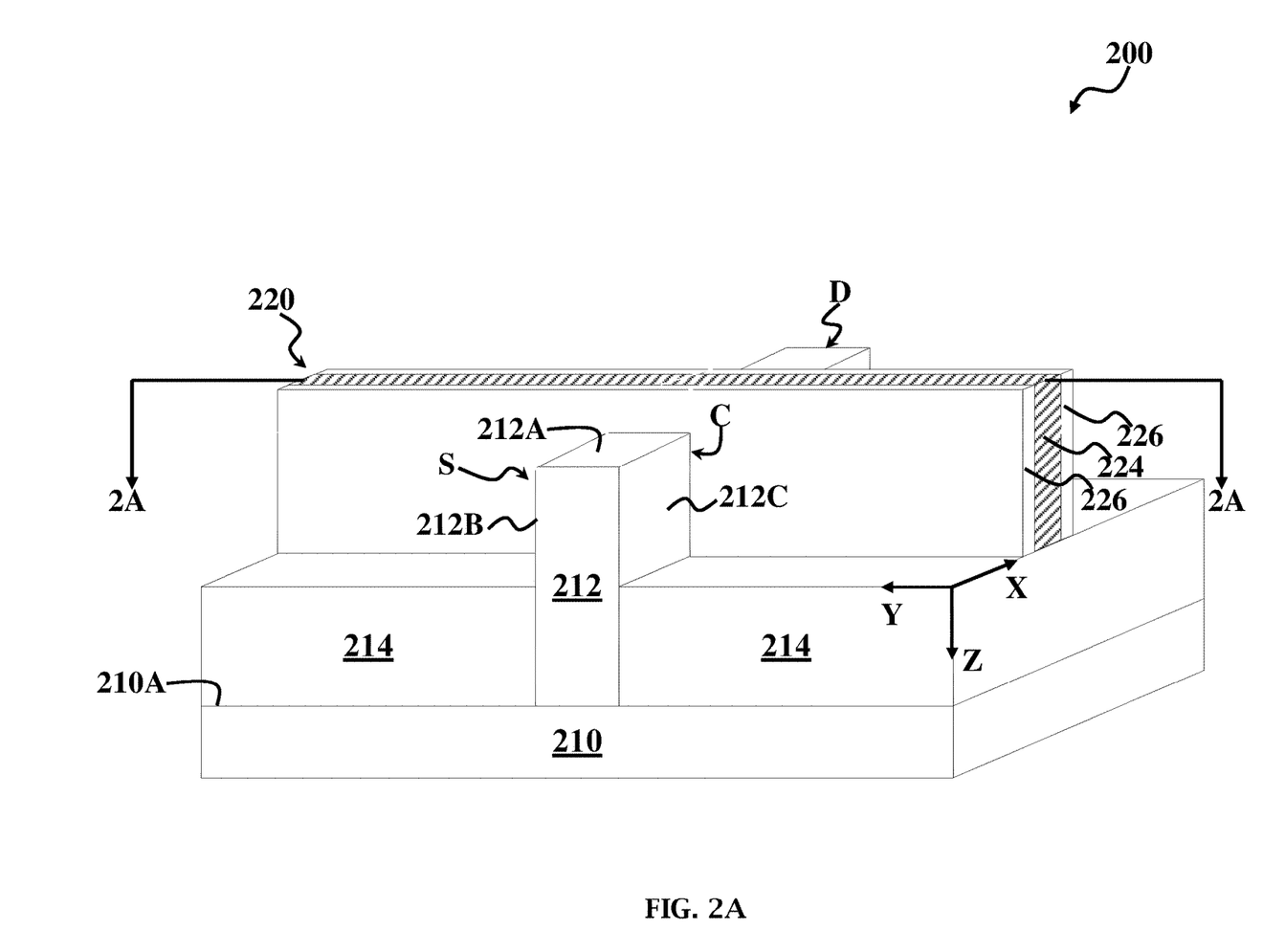
FIG. 2A is a perspective view of an integrated circuit device.
Figure 2B:
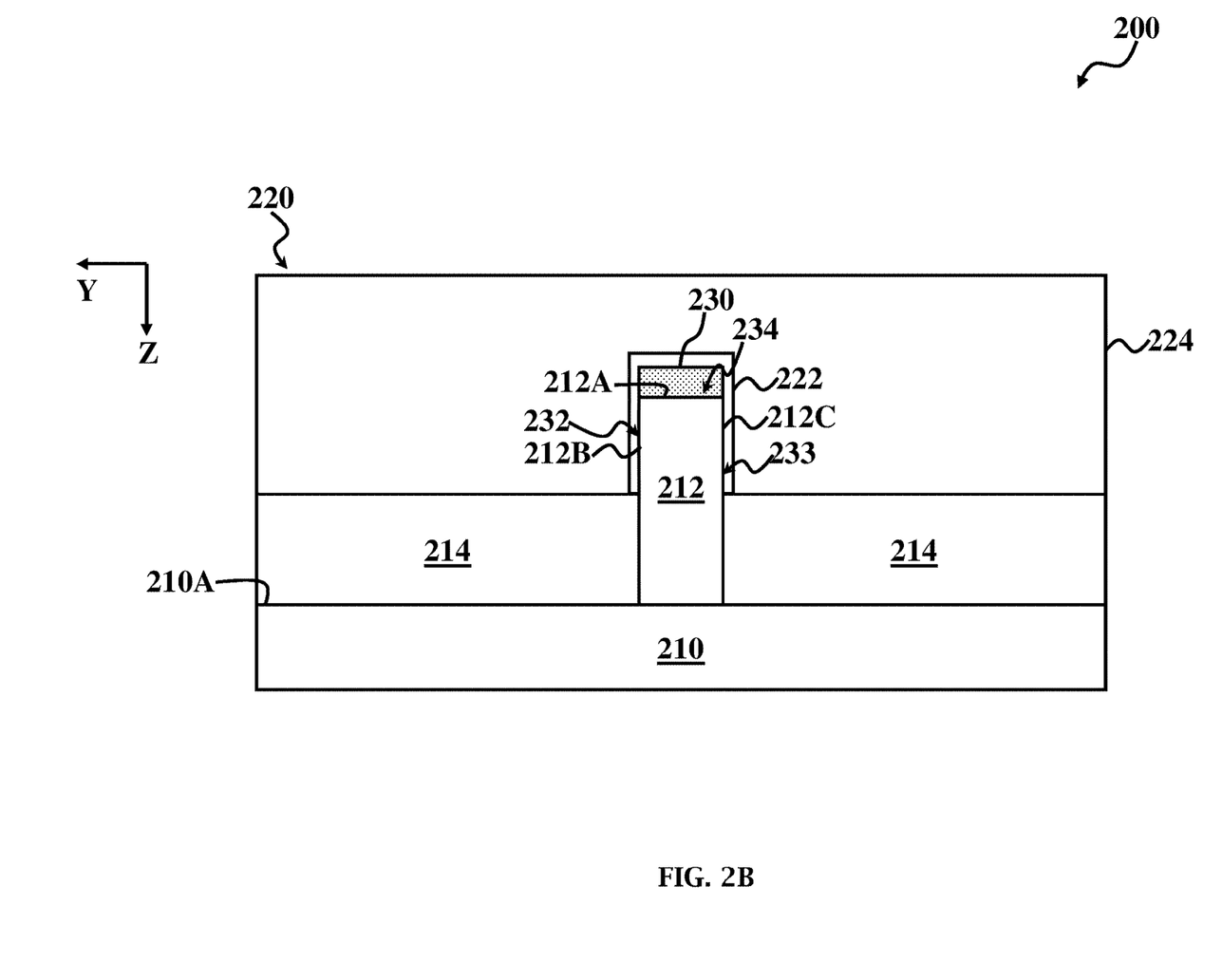
FIG. 2B is a diagrammatic cross-sectional view of the integrated circuit device of FIG. 2A taken along line 2A-2A, according to various aspects of the present disclosure.

FIG. 2A is a perspective view of an integrated circuit device 200, and FIG. 2B is a diagrammatic cross-sectional view of the integrated circuit device 200 of FIG. 2A taken along line 2A-2A, according to various aspects of the present disclosure. In the depicted embodiment, the integrated circuit device 200 is a fin-like field effect transistor (FinFET) device. The term FinFET device refers to any fin-based, multi-gate transistor. The FinFET device 200 may be included in a microprocessor, memory cell, and/or other integrated circuit device. FIG. 2A and FIG. 2B will be discussed concurrently and have been simplified for the sake of clarity to better understand the inventive concepts of the present disclosure. Additional features can be added in the FinFET device 200, and some of the features described below can be replaced or eliminated in other embodiments of the FinFET device 200.

The FinFET device 200 includes a substrate (wafer) 210. The substrate 210 is a group III-V compound semiconductor substrate that includes a surface 210A having a (100) crystallographic orientation. In the depicted embodiment, the substrate 210 includes indium arsenide (InAs). The substrate 210 may thus be referred to as an indium arsenide (InAs) substrate. Alternatively or additionally, the substrate 210 includes gallium arsenide (GaS), gallium phosphide (GaP), indium phosphide (InP), aluminum arsenide (AlAs), gallium nitride (GaN), indium antimonide (InSb), gallium arsenide phosphide (GaAsP), aluminum indium arsenide (AnnAs), aluminum gallium arsenide (AlGaAs), gallium indium arsenide (GaInAs), gallium indium phosphide (GaInP), indium arsenide phosphide (InAsP), gallium indium arsenide phosphide (GaInAsP), other group III-V compound semiconductor materials, or combinations thereof. The substrate 210 includes various doping configurations depending on design requirements of the device 100. For example, the substrate 210 may include doped regions doped with p-type dopants, such as boron or $BF_2$; doped regions doped with n-type dopants, such as phosphorus or arsenic; or combinations thereof. The doped regions may be formed on the semiconductor substrate, in a P-well structure, in a N-well structure, in a dual-well structure, or using a raised structure.

A fin structure is disposed over the substrate 210 and includes a fin 212 that extends from the substrate 210. The fin structure may include more or less fins 212 depending on design requirements of the FinFET device 200. In the depicted embodiment, the fin 212 is an extension of the substrate 210 and includes the group III-V compound semiconductor material, such as indium arsenide (InAs). The fin 212 includes a top surface 212A, a sidewall surface 212B, and a sidewall surface 212C. The sidewall surfaces 212B and 212C extend substantially perpendicular to the top surface 212A. In the depicted embodiment, the top surface 212A has a (100) crystallographic orientation, and the sidewall surfaces 212B and 212C have a (crystallographic orientation. It is noted that, in the depicted embodiment, the top surface 212A of the fin 212 has a same crystallographic orientation as the top surface 210A of the substrate 210. The fin structure is formed by implementing a lithography and etching process. For example, beginning with the substrate 210, a lithography and etching process forms trenches in the substrate 210, thereby forming the fin 212 that extends from the substrate 210. The lithography process may include resist coating (for example, spin-on coating), soft baking, mask aligning, exposure, post-exposure baking, developing the resist, rinsing, drying (for example, hard baking), other suitable processes, or combinations thereof. Alternatively, the lithography process can be implemented or replaced by other methods, such as maskless lithography, electron-beam writing, ion-beam writing, and/or nanoimprint technology. The etching process includes a dry etching process, wet etching process, other suitable etching process, or combinations thereof. In an example, the fin 212 is formed by forming a resist layer over the substrate 210, exposing the resist to a pattern, and developing the resist to form a masking element including the resist. The masking element may then be used to etch the fin 212 into the substrate 210, for example, by using a reactive ion etch (RIE). The fin 212 may be formed by a double-patterning lithography (DPL) process. DPL is a method of constructing a pattern on a substrate by dividing the pattern into two interleaved patterns. DPL allows enhanced feature (for example, fin) density. Various DPL methodologies may be used including double exposure (such as using two mask sets), resist freezing, other suitable processes, or combinations thereof.

Isolation feature 214, such as a shallow trench isolation (STI) feature and/or local oxidation of silicon (LOCOS) feature, surrounds the fin structure (in the depicted embodiment, the fin 212) and isolates the fin 212 from other fins or other features, devices, or regions of the FinFET device 200. The isolation feature 214 includes silicon oxide, silicon nitride, silicon oxynitride, other suitable material, or combinations thereof. In the depicted embodiment, the isolation feature 214 is a shallow trench isolation (STI) that includes an oxide material, such as silicon oxide. The isolation feature 214 is formed by a suitable process. For example, in the depicted embodiment, the isolation feature 214 may be formed by completely or partially filling the trenches that are etched in the substrate 210 to form the fins 212 with an insulating material. The filled trenches may have a multi-layer structure, for example, a thermal oxide liner layer with silicon nitride filling the trench.

A gate structure 220 traverses the fin structure (specifically, the fin 212), such that the gate structure 220 interposes a source region, S, and a drain region, D, of the fin 212. A channel region (or channel), C, is defined between the source region of the fin 212 and the drain region of the fin 212, and the gate structure 220 is disposed over the channel region of the fin 212. The source region and the drain region may include doped regions disposed in the fin 212, such as lightly doped source and drain (LDD) regions, heavily doped source and drain (HDD) regions, other doped regions, or combinations thereof. A doping species of the doped regions depends on the type of FinFET device 200 being fabricated and includes p-type dopants, such as boron or $BF_2$, n-type dopants, such as phosphorus or arsenic, or combinations thereof. The doped regions are formed in the fin 212 by ion implantation processes, lithography processes, diffusion processes, annealing processes (for example, rapid thermal annealing processes and/or laser annealing processes), other processes, or combinations thereof. The doped regions may further include raised source and drain features, such as epitaxial features. The raised source and drain features can be formed by an epitaxy process, such as a CVD deposition technique (for example, vapor-phase epitaxy (VPE) and/or ultra-high vacuum CVD (UHV-CVD)), molecular beam epitaxy, other process, or combinations thereof.

The gate structure 220 includes a gate stack that includes a gate dielectric 222 and a gate electrode 224. The gate stack may include numerous other layers (such as capping layers, diffusion layers, barrier layers, hard mask layers, or combinations thereof) depending on design requirements of the FinFET device 200. The gate structure 220 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

The gate dielectric 222 is disposed over the channel region of the fin 212, specifically on the surfaces 212B and 212C having the (110) crystallographic orientation. In the depicted embodiment, the gate dielectric 222 includes a high-k dielectric material. Exemplary high-k dielectric materials include hafnium oxide ($HfO_2$), aluminum oxide ($Al_2O_3$), zirconium oxide ($ZrO_2$), gallium oxide ($Ga_2O_3$), titanium oxide ($TiO_2$), lanthanum oxide ($La_2O_3$), tantalum oxide ($Ta_2O_5$), gadolinium oxide ($Gd_2O_3$), yttrium oxide ($Y_2O_3$), hafnium dioxide-alumina ($HfO_2$—$Al_2O_3$) alloy, hafnium aluminum oxide (HfAlO), hafnium silicon oxide (HfSiO), hafnium silicon oxynitride (HfSiON), hafnium tantalum oxide (HMO), hafnium titanium oxide (HfTiO), hafnium zirconium oxide (HfZrO), titanium aluminum oxide (TiAlO), lanthanum aluminum oxide (such as $LaAlO_3$), other high-k dielectric material, or combinations thereof. The gate dielectric 222 is formed by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, other suitable process, or combinations thereof. In an example, the gate dielectric 222 is an aluminum oxide ($Al_2O_3$) layer formed by an atomic layer deposition process, and the gate dielectric 222 may be referred to as an ALD $Al_2O_3$ layer. In an example, the gate dielectric 222 is a hafnium oxide ($HfO_2$) layer, and the gate dielectric 222 may be referred to as an ALD $HfO_2$ layer.

The gate electrode 224 is disposed over the gate dielectric 222. The gate electrode 224 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the gate electrode 224 may be doped or undoped depending on design requirements of the FinFET device 200. The gate electrode 224 is formed by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, other suitable process, or combinations thereof.

The gate structure 220 further includes spacers 226 that are disposed on sidewalls of the gate stack, specifically along the gate electrode 224. The spacers 226 include a dielectric material, such as silicon oxide, silicon nitride, silicon oxynitride, other dielectric material, or combinations thereof. The spacers 226 may include a multi-layer structure, such as a multi-layer structure including a silicon nitride layer and a silicon oxide layer. The spacers 226 are formed by a suitable process to a suitable thickness. For example, the spacers 226 may be formed by depositing a silicon nitride layer and a silicon oxide layer and then dry etching the silicon oxide and silicon nitride layers to form the spacers 226 as illustrated in FIG. 2A.

A hard mask layer 230 is disposed over the fin structure, particularly the fin 212. In the depicted embodiment, the hard mask layer 230 is disposed between the gate dielectric 222 and the top surface 212A of the fin 212 having the (100) crystallographic orientation. The hard mask layer 230 includes an oxide-based or nitride-based dielectric material, such as silicon oxide, silicon nitride, silicon oxynitride, other oxide-based or nitride-based material, or combinations thereof. Alternatively, the hard mask layer 230 is omitted from the FinFET device 200, such that the gate dielectric 222 is disposed on the top surface 212A of the fin 212 having the (100) crystallographic orientation.

In the depicted embodiment, the FinFET device 200 includes an interface 232, an interface 233, and an interface 234. The interfaces 232 and 233 are between the gate dielectric 222 and the fin 212 including the group III-V compound semiconductor material, respectively the sidewall surfaces 212B and 212C of the fin 212 having the (110) crystallographic orientation. The interfaces 232 and 233 are oxide-free, meaning that the interfaces 232 and 233 are substantially free of native oxide of the group III-V compound semiconductor material, such that virtually no detectable interfacial oxide exists between the gate dielectric 222 and the group III-V compound semiconductor material of the fin 212 at the interfaces 232 and 233. The oxide-free interfaces 232 and 233 result because the sidewall surfaces 212B and 212C having the (110) crystallographic orientation are electrically passive surfaces that can prevent (or substantially reduce) oxidation from occurring at the surfaces 212B and 212C of the fin 212 including the group III-V compound semiconductor material, for example, before and during deposition of the gate dielectric 222. More specifically, it has been observed that the surfaces 212B and 212C exhibit lower defect density (in other words, a low density of electrically active defects) when the surfaces 212B and 212C have the (110) crystallographic orientation, as opposed to another crystallographic orientation, such as a (100) crystallographic orientation. Such lower defect density substantially reduces (or eliminates) Fermi level pinning, such that the interfaces 232 and 233 may also be referred to as an "unpinned interfaces." Accordingly, in the depicted embodiment, the hard mask layer 230 is disposed between the gate dielectric 222 and the top surface 212A of the fin 212 having the (100) crystallographic orientation to reduce (or prevent) charge transport in the channel region of the fin 212 below the interface 234, thereby avoiding unwanted affects resulting from the higher defect density of the surface 212A having the (100) crystallographic orientation. The interfaces 232, 233, and 234 thus provides improved performance of the FinFET device 200. In the present example, where the group III-V compound semiconductor material is InAs, the oxide-free interfaces 232 and 233 result because the surfaces 212B and 212C having the (110) crystallographic orientation have an equivalent number of anion (As ions) and cation (In ions) dangling bonds, which provides a balanced charge distribution at the surfaces 212B and 212C having the (110) crystallographic orientation, as compared to the surface 212A having the (100) crystallographic orientation. It is further noted that where the hard mask layer 230 is omitted from the FinFET device 200, such that the gate dielectric 222 is disposed on the top surface 212A of the fin 212 having the (100) crystallographic orientation, the FinFET device 200 further exhibits improved performance form the oxide-free interfaces 232 and 233. Different embodiments may have different advantages, and no particular advantage is necessarily required of any embodiment.

The FinFET device 200 may undergo further processing to form various other features. For example, contact features, such as silicide regions, may be formed on the gate structure 220 and/or the source and drain regions of the fin 212. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other silicide material, or combinations thereof. In an example, the contact features are formed by a salicide (self-aligned silicide) process. An interlevel dielectric layer (ILD) layer may be formed over the substrate 210. The ILD layer includes a dielectric material, such as silicon oxide, silicon nitride, silicon oxynitride, TEOS formed oxide, phosphosilicate glass (PSG), borophosphosilicate glass (BPSG), a low-k dielectric materials, other dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other low-k dielectric materials, or combinations thereof. The ILD layer can include a multilayer structure having multiple dielectric materials. A multilayer interconnect (MLI) structure (including various conductive and dielectric layers) may be formed over the substrate 210, configured to connect the various features or structures of the FinFET device 200. For example, the MLI structure may provide electrical interconnection to the FinFET device 200, such as to the gate stack of the gate structure 220 and the source and drain regions of the fin 212 of the FinFET device 200. The MLI structure includes vertical interconnect features, such as vias or contacts, and horizontal interconnect features, such as conductive lines. The various MLI features include various conductive materials. In an example, a damascene or dual damascene process is used to form the MLI structure.

Figure 3:
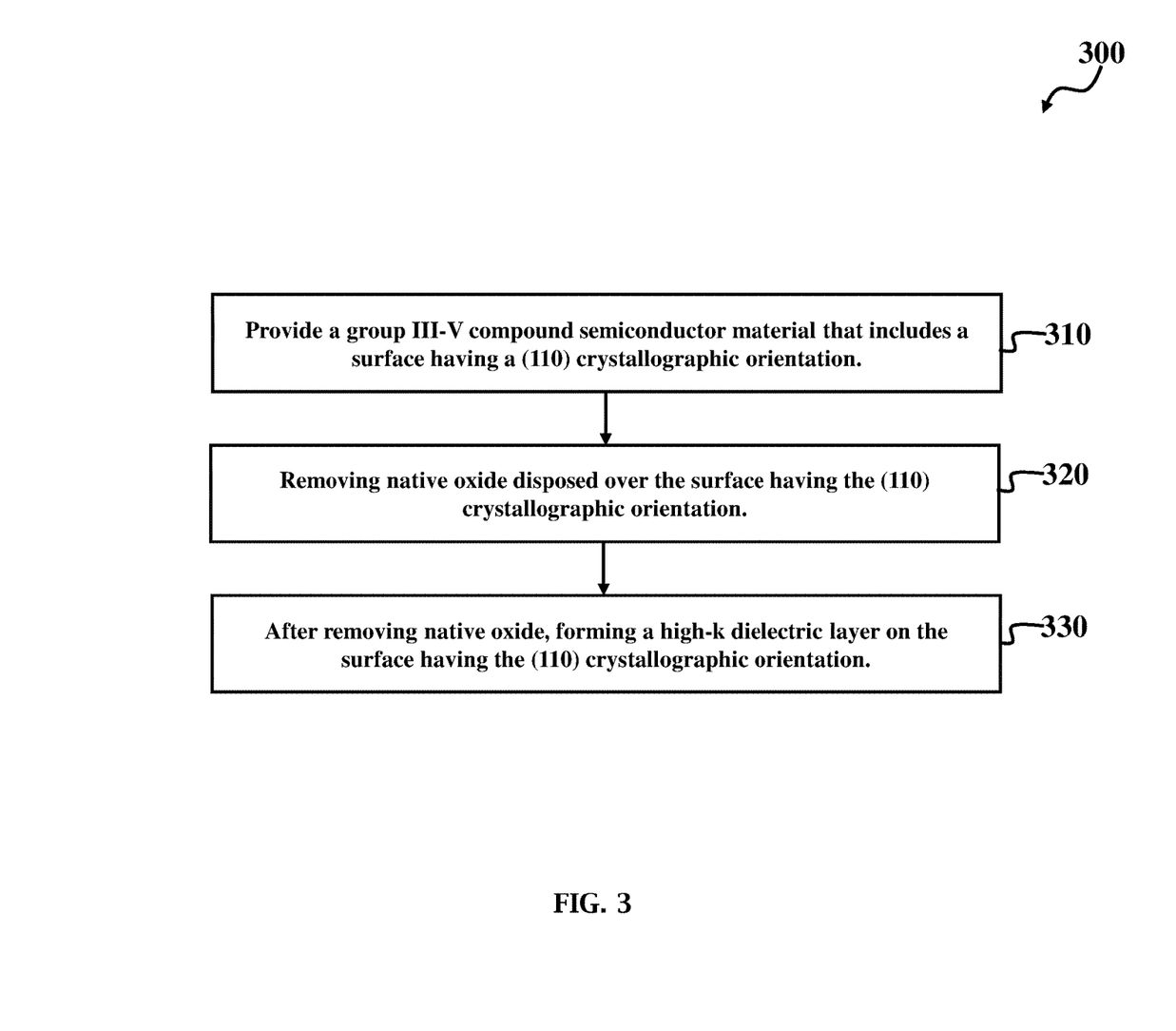
FIG. 3 is a flow chart of a method for fabricating an integrated circuit device, such as the integrated circuit device of FIG. 1, according to various aspects of the present disclosure.

FIG. 3 is a flow chart of a method 300 for fabricating a device, in portion or entirety, according to various aspects of the present disclosure. For example, the method 300 fabricates the device 100 of FIG. 1 or the FinFET device 200 of FIGS. 2A and 2B. The method 300 begins at block 310 where a group III-V compound semiconductor material that includes a surface having a (110) crystallographic orientation is provided. In an example, the group III-V compound semiconductor material is a group III-V compound semiconductor substrate that includes a surface having a (110) crystallographic orientation. In another example, the group III-V compound semiconductor material is a fin structure that includes a surface having a (110) crystallographic orientation. At block 320, native oxide disposed over the surface having the (110) crystallographic orientation is removed. In an example, to remove native oxide, the surface having the (110) crystallographic orientation is cleaned using a hydrochloric acid (HCl) solution, such as a diluted HCl solution. It has been observed that, even after cleaning a group III-V compound semiconductor material having a (100) crystallographic orientation, some residual native oxide of the group III-V compound semiconductor material remains. At block 330, after removing native oxide, a high-k dielectric layer is formed on the surface having the (110) crystallographic orientation. In an example, the high-k dielectric layer is formed by an atomic layer deposition process. For example, an aluminum oxide ($Al_2O_3$) layer or a hafnium oxide ($HfO_2$) layer is formed by the atomic layer deposition process. In an example, before performing the atomic layer deposition process, a pre-treatment process exposes the surface having the (110) crystallographic orientation to a treatment gas (such as TMA (trimethylaluminum ($Al(CH_3)_3$)) or TEMAH (tetrakis(ethylmethylamino) hafnium). The method 300 may continue to fabricate other features of the device. For example, a gate electrode layer may be formed over the high-k dielectric layer, thereby forming a gate stack that includes the high-k dielectric layer and the gate electrode layer. Spacers may be formed along sidewalls of the gate stack and/or source/drain features may be formed in the semiconductor substrate, such that the gate stack interposes the source/drain features. Additional steps can be provided before, during, and after the method 300, and some of the steps described can be replaced or eliminated for additional embodiments of the method 300.

The present disclosure provides for many different embodiments. An exemplary device includes a group III-V compound semiconductor substrate that includes a surface having a (110) crystallographic orientation, and a gate stack disposed over the group III-V compound semiconductor substrate. The gate stack includes a high-k dielectric layer disposed on the surface having the (110) crystallographic orientation, and a gate electrode disposed over the high-k dielectric layer. An interface between the high-k dielectric layer and the surface having the (110) crystallographic orientation is substantially free of native oxide of the group III-V compound semiconductor substrate. In an example, the group III-V compound semiconductor substrate is an InAs substrate, and the high-k dielectric layer includes hafnium oxide ($HfO_2$) or aluminum oxide ($Al_2O_3$). In an example, an interface between the high-k dielectric layer and the surface having the (110) crystallographic orientation is substantially free of an interfacial oxide layer. The device may further include a source region and a drain region disposed in the group III-V compound semiconductor substrate, wherein the gate stack interposes the source region and the drain region.

An exemplary integrated circuit device includes a group III-V compound semiconductor substrate including a fin structure, wherein the fin structure has a top surface having a (100) crystallographic orientation and sidewall surfaces having a (110) crystallographic orientation; and a gate structure traversing the fin structure, the gate structure traversing a source region and a drain region of the fin structure such that a channel region is defined between the source region and the drain region. The integrated circuit device further includes a hard mask layer disposed in the channel region over the top surface of the fin structure having the (100) crystallographic orientation. The gate structure includes a gate dielectric and a gate electrode, the gate dielectric being disposed over the hard mask layer and the sidewall surfaces of the fin structure having the (110) crystallographic orientation, and the gate electrode being disposed over the gate dielectric. The gate dielectric may be disposed on the sidewall surfaces of the fin structure having the (110) crystallographic orientation. An interface between the gate dielectric and the sidewall surfaces of the fin structure having the (110) crystallographic orientation is substantially free of native oxide of the group III-V compound semiconductor substrate. In an example, the group III-V compound semiconductor substrate is an InAs substrate; the hard mask layer includes one of an oxide-based dielectric material and a nitride-based dielectric material; and the gate dielectric includes a high-k dielectric material, such as $HfO_2$ and $Al_2O_3$. In an example, an interface between the gate dielectric and the sidewall surfaces of the fin structure having the (110) crystallographic orientation is substantially free of an interfacial oxide layer.

An exemplary method includes providing a group III-V compound semiconductor material that includes a surface having a (110) crystallographic orientation; removing native oxide disposed over the surface having the (110) crystallographic orientation; and after removing native oxide, forming a gate stack over the group III-V compound semiconductor material. Forming the gate stack includes forming a high-k dielectric layer disposed on the surface having the (110) crystallographic orientation, and forming a gate electrode disposed over the high-k dielectric layer. In an example, providing the group III-V compound semiconductor material that includes the surface having the (110) crystallographic orientation includes providing an InAs substrate that includes a surface having a (110) crystallographic orientation. In another example, providing the group III-V compound semiconductor material that includes the surface having the (110) crystallographic orientation includes providing a fin structure that includes a top surface having a (100) crystallographic orientation and sidewall surfaces having a (110) crystallographic orientation; and the method further includes forming a hard mask layer over the top surface having the (100) crystallographic orientation before forming the gate stack. Removing native oxide disposed over the surface having the (110) crystallographic orientation may include cleaning the surface having the (110) crystallographic orientation with a hydrochloric acid (HCl) solution. Forming the high-k dielectric layer disposed on the surface having the (110) crystallographic orientation may include performing an atomic layer deposition process to form one of a $Al_2O_3$ layer and a $HfO_2$ layer. In an example, forming the high-k dielectric layer disposed on the surface having the (110) crystallographic orientation further includes, before performing the atomic layer deposition process, pre-treating the surface having the (110) crystallographic orientation with one of a TMA (trimethylaluminum ($Al(CH_3)_3$)) precursor gas or TEMAH (tetrakis(ethylmethylamino)hafnium) precursor gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a fin structure extending from a semiconductor substrate, wherein the fin structure has a top surface having a (100) crystallographic orientation and sidewall surfaces having a (110) crystallographic orientation, the sidewall surfaces having the (110) crystallographic orientation extending to a top surface of the semiconductor substrate having a (100) crystallographic orientation;
    a gate structure traversing the fin structure, the gate structure traversing a source region and a drain region of the fin structure such that a channel region is defined between the source region and the drain region; and
    a hard mask layer disposed in the channel region over the top surface of the fin structure having the (100) crystallographic orientation,
    wherein the gate structure includes a gate dielectric, a gate electrode, and a sidewall spacer disposed alongside the gate dielectric and the gate electrode, the gate dielectric being disposed over the hard mask layer and the sidewall surfaces of the fin structure having the (110) crystallographic orientation, and the gate electrode being disposed over the gate dielectric, wherein the sidewall spacer is disposed on and covers a vertical side surface of the hard mask layer, wherein the fin structure includes a III-V semiconductor material.

2. The device of claim 1, wherein the gate dielectric physically contacts the sidewall surfaces, and
    wherein the hard mask layer prevents the gate dielectric from physically contacting the top surface of the fin structure having the (100) crystallographic orientation.

3. The device of claim 1, wherein the gate dielectric includes a high-k dielectric material and the gate electrode includes a metal material.

4. The device of claim 1, wherein the fin structure and the semiconductor substrate are formed of the same semiconductor material.

5. The device of claim 1, wherein the hard mask layer includes an oxide material.

6. The device of claim 1, wherein the hard mask layer includes a nitride material.

7. The device of claim 1, wherein the gate electrode includes a polysilicon material.

8. A device comprising:
a fin structure extending over a semiconductor substrate, wherein the fin structure has a first sidewall surface, a second sidewall surface, and a top surface extending from the first sidewall surface to the second sidewall surface, the top surface facing away from the semiconductor substrate, the first sidewall surface having a (110) crystallographic orientation extending to a top surface of the semiconductor substrate having a (100) crystallographic orientation,
the top surface of the fin structure having the (100) crystallographic orientation; and
a gate structure traversing the fin structure, wherein the gate structure includes:
a hard mask layer disposed on the top surface of the fin structure;
a gate dielectric disposed over the hard mask layer;
a gate electrode disposed over the gate dielectric; and
a sidewall spacer disposed alongside the hard mask layer, the gate dielectric, and the gate electrode, wherein the sidewall spacer covers a side surface of the hard mask layer, wherein the fin structure includes a III-V semiconductor material.

9. The device of claim 8, wherein each of the first sidewall surface and the second sidewall surface of the fin structure has a (110) crystallographic orientation.

10. The device of claim 8, wherein the gate electrode includes a polysilicon material.

11. The device of claim 8, wherein the gate dielectric is disposed directly on the first sidewall surface of the fin structure such that an interface between the gate dielectric and the first sidewall surface is substantially free of native oxide.

12. The device of claim 8, wherein the gate dielectric includes a high-k dielectric material.

13. A device comprising:
a semiconductor fin structure extending over a semiconductor substrate, wherein the semiconductor fin structure has a first sidewall surface and an opposing second sidewall surface and a top surface extending between the first sidewall surface and the second sidewall surface, the first sidewall surface having a (110) crystallographic orientation extending to a top surface of the semiconductor substrate having a (100) crystallographic orientation;
a dielectric isolation structure embedded within the semiconductor substrate surrounding the semiconductor fin structure;
a hard mask layer disposed over the top surface of the semiconductor fin structure;
a gate dielectric disposed over and physically contacting the hard mask layer;
a gate electrode disposed over the gate dielectric; and
a sidewall spacer disposed alongside the hard mask layer, the gate dielectric, and the gate electrode, wherein the sidewall spacer covers a side surface of the hard mask layer, wherein the semiconductor fin structure includes a III-V semiconductor material.

14. The device of claim 13, wherein each of the first sidewall surface and the second sidewall surface of the semiconductor fin structure has a (110) crystallographic orientation.

15. The device of claim 13, wherein the gate dielectric physically contacts the first and second sidewall surfaces.

16. The device of claim 15, wherein the hard mask layer prevents the gate dielectric from physically contacting the top surface of the semiconductor fin structure.

17. The device of claim 13, wherein the semiconductor fin structure and the semiconductor substrate are formed of the same material.

18. The device of claim 13, wherein a portion of the semiconductor fin structure is embedded in the dielectric isolation structure.

19. The device of claim 13, wherein the hard mask layer includes an oxide material.

20. The device of claim 13, wherein the sidewall spacer extends to and physically contacts the dielectric isolation structure embedded within the semiconductor substrate.

* * * * *